US008482290B2

(12) United States Patent  
Steckley et al.

(10) Patent No.: US 8,482,290 B2  
(45) Date of Patent: Jul. 9, 2013

(54) SYSTEM FOR INTELLIGENT AUTOMATED RESPONSE TO LINE FREQUENCY AND VOLTAGE DISTURBANCES BY A CENTRAL CONTROL POINT COMMUNICATION WITH A PLURALITY OF LOAD CONTROL DEVICES

(75) Inventors: Andrew Steckley, Vancouver, WA (US); Daniel R Russell, Portland, OR (US); Michael G. Hoffman, Portland, OR (US); James D. Seymour, Hillsboro, OR (US); Carl B. Van Wormer, Hillsboro, OR (US)

(73) Assignee: Makad Energy, LLC, Vancouver, WA (US)

( * ) Notice: Subject to any disclaimer, the term of this patent is extended or adjusted under 35 U.S.C. 154(b) by 482 days.

(21) Appl. No.: 12/714,516

(22) Filed: Feb. 28, 2010

(65) Prior Publication Data

US 2010/0219808 A1    Sep. 2, 2010

Related U.S. Application Data

(60) Provisional application No. 61/156,772, filed on Mar. 2, 2009.

(51) Int. Cl.
   *G01R 31/08* (2006.01)
(52) U.S. Cl.
   USPC .......................................... 324/522; 324/520
(58) Field of Classification Search
   USPC ....................................................... 324/522
   See application file for complete search history.

(56) References Cited

U.S. PATENT DOCUMENTS 4,870,340 A * 9/1989 Kral ............................. 323/235
6,961,642 B2   11/2005 Horst et al.
7,010,363 B2    3/2006 Donnelly et al.
7,110,832 B2    9/2006 Ghent
7,149,605 B2   12/2006 Chassin et al.
7,242,114 B1    7/2007 Cannon et al.
7,355,301 B2    4/2008 Ockert et al.
7,383,036 B2    6/2008 Kang
7,423,546 B1    9/2008 Aisa
7,444,401 B1   10/2008 Keyghobad et al.
7,469,550 B2   12/2008 Chapman, Jr. et al.
7,469,627 B2   12/2008 Li

FOREIGN PATENT DOCUMENTS

WO   PCT/US2010/022878   *   2/2010   ................... 700/295

OTHER PUBLICATIONS

U.S. Appl. No. 12/567,798, Steckley et al.
Summary of Pacific Northwest GridWise(TM) Testbed Demonstration Projects, Part II—Grid Friendly(TM) Appliance Project, under contract to Department of Energy, DE-AC05-76RL01.

* cited by examiner

*Primary Examiner* — Thomas Valone (57) ABSTRACT

Systems for intelligent automated response to line frequency and voltage disturbances by a central control point communication with a plurality of load control devices. The systems may include a load control device adapted to communicate with one or more energy consuming devices. The load control device may have a load control device firmware adapted to receive and process control directives to change the load of at least one energy consuming device. A central control point may be associated with the building and may be connected to the line power. The central control point may include a circuit adapted to monitor the line power and a central control point firmware adapted to detect the line disturbance. The central control point firmware may be in communication with the load control device firmware and may be adapted to transmit the control directives to the load control device firmware.

18 Claims, 6 Drawing Sheets

SYSTEM FOR INTELLIGENT AUTOMATED RESPONSE TO LINE FREQUENCY AND VOLTAGE DISTURBANCES BY A CENTRAL CONTROL POINT COMMUNICATION WITH A PLURALITY OF LOAD CONTROL DEVICES

RELATED APPLICATIONS

The present application claims the benefit of U.S. Provisional Patent Application Ser. No. 61/156,172, filed on Mar. 2, 2009, the complete disclosure of which is hereby incorporated by reference in its entirety and for all purposes.

FIELD OF THE DISCLOSURE

The present disclosure relates to a system and a method for automatically detecting and responding to electric transmission grid distribution power disturbances that result in under/over frequency and/or under/over voltage events. In particular, response is provided by shedding or adding electric loads proximal to the distribution power disturbance.

BACKGROUND OF THE DISCLOSURE

Various systems operating within an industrial, commercial or residential environment that detect, and take autonomous action in response to, electrical distribution line disturbances have been around for many years. Grid operators are very interested in these types of devices since they can increase the reliability and stability of the power grid. The importance of detecting under-frequency, for example, which indicates a stressed grid, and responding by rapidly reducing load on the grid in order to stabilize the system, has been well documented (Pacific Northwest GridWise™ Testbed Demonstration Projects, Part II—Grid Friendly™ Appliance Project, under contract to Department of Energy, DE-AC05-76RL01830).

To date, solutions have typically been localized to individual energy consuming devices in an industrial, commercial, or residential building. For example, there are thermostats that can detect line disturbances based on anomalies in the 24VAC transformed power used by the thermostat electronics and delivered from a furnace system (U.S. Pat. No. 7,242,114). In some cases, they are further capable of running internal decision making algorithms, and then setting back the thermostat settings, or completely turning off a furnace or air conditioner. There are also grid friendly components that enable appliances to perform much the same action autonomously, based upon hard-coded parameters used to determine a line disturbance and effect load shedding. However, these products all require that each load control device that controls an energy consuming device, such as a thermostat for a heating ventilation and air conditioning (HVAC) system, refrigeration temperature control, water heater temperature control, lighting level control, baseboard heater control, etcetera employ line disturbance detection circuitry that can take autonomous action in response to the detected disturbance. Since these load control devices are often embedded within the energy consuming device they control, it is usually necessary to purchase a new appliance or piece of equipment that already employs the line disturbance detection circuitry. In new construction this may be cost-effective since new appliances and equipment are purchased and installed as part of the construction, although it is worth noting the extra cost of circuitry for detecting line disturbances burdens each appliance or piece of equipment. Replacing appliances or equipment in existing buildings with new appliances, or equipment employing line disturbance detection circuitry to provide load response sufficient to contribute to stabilizing the grid, is not cost effective.

There is need in the industry to provide local response to line disturbances without requiring that every piece of equipment under control be replaced with equipment employing line disturbance detection circuitry and relying on each of these to independently make a load reduction or addition decision. In particular, a central control point is needed that can detect line disturbances, quickly determine the proper course of action, and then communicate with load control devices that do not have line disturbance detection circuitry but can respond to a control directive from the central point of control.

SUMMARY OF THE DISCLOSURE

The disturbance response system of the present disclosure meets the aforementioned needs of the industry. In the some embodiments, the disturbance response component of the present disclosure comprises a central control device, local to the disturbance, that makes intelligent decisions to increase/reduce or to connect/disconnect local loads in response to the detected line disturbance in the electrical distribution system. The line disturbance may take the form of line under frequency (LUF), line under voltage (LUV), line over frequency (LOF) and/or line over voltage (LOV). Further, the apparatus and methods of the present disclosure allow rapid and efficient response to such disturbances, minimizing the overall impact of each disturbance on the equipment and the electrical grid.

The objective of the present disclosure is to deliver a cost effective mechanism for capturing voltage and frequency characteristics of the main power source to a building, using a central control point to perform algorithmic testing of said characteristics, to detect anomalies from a known good baseline, to determine if the detected anomalies represent a line disturbance, to send signals to load control devices throughout a building, and to cause the building to lower or raise electrical consumption in response to the anomalies, performing all these actions within a timeframe that can help stabilize the power source.

Some embodiments of the disclosure include a microprocessor-based central control point located at the site, which monitors the line power and communicates over a local network with individual load control devices located around the site such as thermostats, load control modules, lighting control devices, appliance control devices, or other load control devices which can raise or lower electrical consumption. The central control point is responsible for monitoring the voltage and frequency characteristics of its power source. Configuration parameters, including preset limits on the voltage amplitudes and AC frequency, can be dynamically modified via an external communication path by a grid operator or third party aggregator. The central control point will detect anomalies in the main power source by comparing the monitored characteristics to the preset limits, determine if the anomalies represent a line disturbance, and apply the proper response if a disturbance is detected. It is then responsible to communicate with the load control devices via a local network to request the proper action of either lowering or raising consumption, to receive confirmation from the load control devices that the proper action was indeed taken, and to record various aspects of the line disturbance and the response. In some embodiments, the local network between control points may wireless, but it could also use a wired connection. A system for wireless communication and control of remote electromechanical devices, including the load control devices of the current disclosure, is described in co-pending and co-owned U.S. patent application Ser. No. 12/567,798, the complete disclosure of which incorporated herein by reference in its entirety and for all purposes.

The systems and methods of the present disclosure reduce the cost of a system that otherwise requires every load control device to implement independent electric distribution line disturbance detection. It ensures consistent response to any detected disturbances, and coordinates the response across multiple load consuming devices. It allows a very fast roll-out by a grid operator of a reliability mechanism for their electric distribution grid by not requiring significant numbers of energy consuming devices in a system be retrofit with replacements employing line disturbance detection capability. Finally, it provides a record of disturbances experienced and the resulting actions taken.

DETAILED DESCRIPTION

Primary Physical Components

Figure 1:
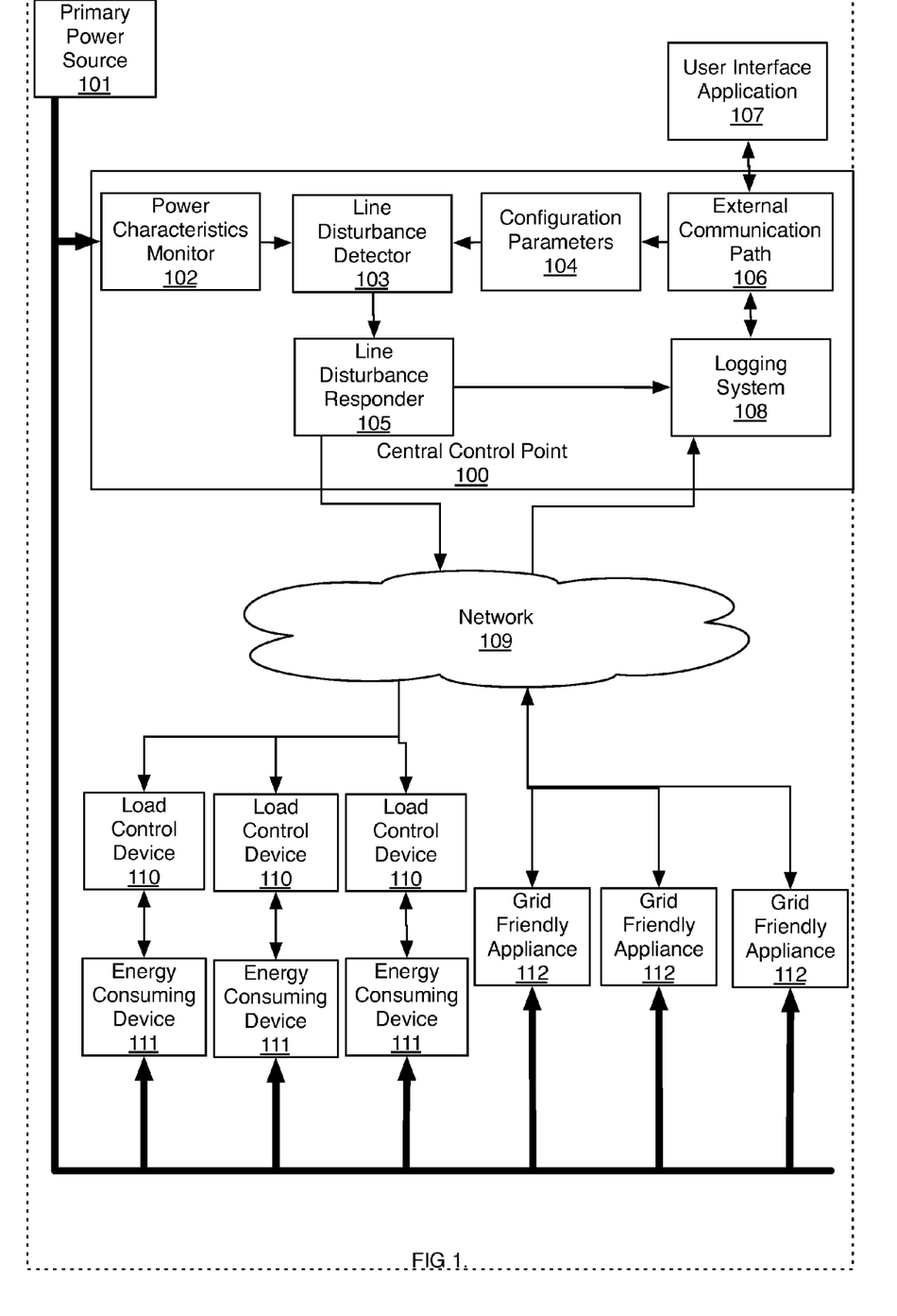
FIG. 1 is a component schematic of an overall system according to the present disclosure.

FIG. 1 represents an overall system according to the present disclosure comprising a central control point 100 and one or more load control devices 110 each controlling one or more energy consuming devices 111. In some embodiments, the central control point may also control one or more grid friendly appliances 112. The central control point 100 comprises the functional elements of a power characteristics monitor 102, a line disturbance detector 103, a set of configuration parameters 104, and a line disturbance responder 105. It may also include a logging system 108 and an external communications path 106. These functional elements may be implemented as distinct hardware and software components, or as hardware and software components that integrate these various elements together. External communications path 106 may provide a pathway to a user interface application 107, which may be deployed remotely or local to central control point 100.

A primary power source 101 supplies power energy consuming devices 111 and grid friendly appliances 112. In the example shown in FIG. 1, the primary power source also supplies the power to the central control point 100 as well. In another embodiment, however, central control point 100 may operate on power from a separate source. In any case, the central control point includes power characteristics monitor 102, which monitors the line voltage from the primary power source 101. In some embodiments, the power connection is accomplished via a standard wall plug for an industrial, commercial, or residential building. Power characteristics monitor 102 provides a digital representation of the waveform of the line voltage supplied by primary power source 101 to line disturbance detector 103. The line disturbance detector detects conditions of the line voltage from the primary power source being outside the voltage and/or frequency specifications stored in configuration parameters 104; these conditions are herein designated anomalies. An electric distribution line disturbance condition is determined to exist when line disturbance detector 103 detects a series of such anomalies persisting for a length of time set in configuration parameters 104. Spurious short-lived anomalies are thus filtered out. The line disturbance detector will then inform line disturbance responder 105 of the presence of a line disturbance and the type of the line disturbance. The line disturbance responder will then determine an appropriate response and the appropriate control directives to send to each load control device 110 over a network 109. Each control directive may cause firmware on the recipient load control device 110 to control its respective energy consuming device 111 in various ways, including changing current levels, shutting off or turning on the device entirely, or applying a duty cycle. The overall desired effect of these control directives, and the load control device firmware that processes them, is to achieve an increase or a decrease of the loads from the energy consuming device. In the event there is one or more grid friendly appliance 112 present on the network, the line disturbance responder may send the appropriate message to inform the grid friendly appliance of the line disturbance. The load control device and/or the grid friendly appliance may send back messages to the central control point, which are processed by logging system 108. These messages may include a confirmation of the success of the action taken to either raise or lower the loads under control, or other information including timestamps. The logging system may also receive information from line disturbance responder 105 regarding the detection and presence of the line disturbance and record this event information. Since the logged messages may include timestamps, the logging system can therefore maintain a complete timeline history of the line conditions before, during, and after the line disturbance and of the response actions taken and the results of such actions.

Figure 2:
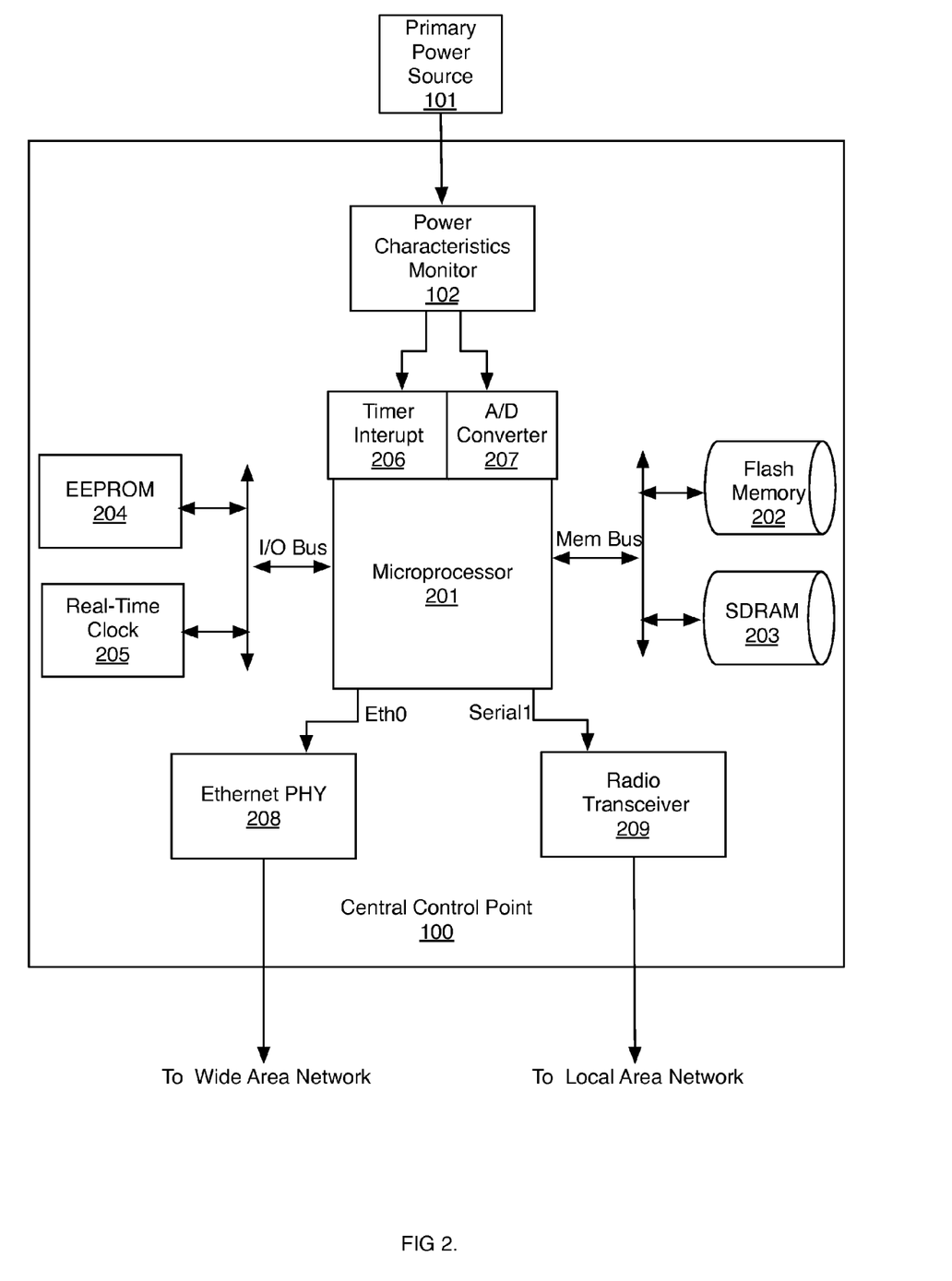
FIG. 2 is a component schematic of the physical elements of an apparatus for monitoring power characteristics.

Referring now to FIG. 2 and with continued reference to FIG. 1, the specifications stored in configuration parameters 104 may be set by one of a possible variety of mechanisms or methods. In the embodiment shown in FIG. 2, these specifications are stored in a non-volatile memory flash memory 202 disposed on central control point 100. They will be updatable at any time by a grid operator or other interested party via user interface application 107 communicating through external communication path 106. In some embodiments, these updates will occur via Internet communications. In addition, the shown embodiment allows logging system 108 to make use of the same non-volatile storage available for storing the specifications for preset limits. Whether stored or not, the occurrence of the line disturbance and the responses may be communicated to interested parties, again using external communication path 106.

FIG. 2 shows a block diagram of an example of the physical components of central control point 100. The various processing functions of the central control point are implemented in firmware, which runs on a microprocessor 201. This central control point firmware performs the computing functions needed for detecting line disturbances via the line disturbance detector, responding to anomalies via the line disturbance responder, logging messages and event information to the logging system communicating with load control devices through the network, storing and retrieving configuration parameters in the non-volatile flash memory, and managing communications through the external communications path. In an alternative embodiment, a separate microprocessor may be incorporated to perform the communications and logging functions, leaving microprocessor 201 to be responsible for the digital sampling and processing functions only. Microprocessor 201 is also shown supported by other components such as a SDRAM 203, an EEPROM 204, and a real time clock 205. The power characteristics monitor delivers the power line waveform to an A/D converter 207 on the microprocessor, and a timer interrupt 206. A wireless home area network is provided through a radio transceiver 209, which provides the local network connection for communicating to the load control devices. An Ethernet connection is provided for broadband Internet communication by an Ethernet MAC integrated on the microprocessor and an Ethernet PHY 208 external to the microprocessor.

Figure 3:
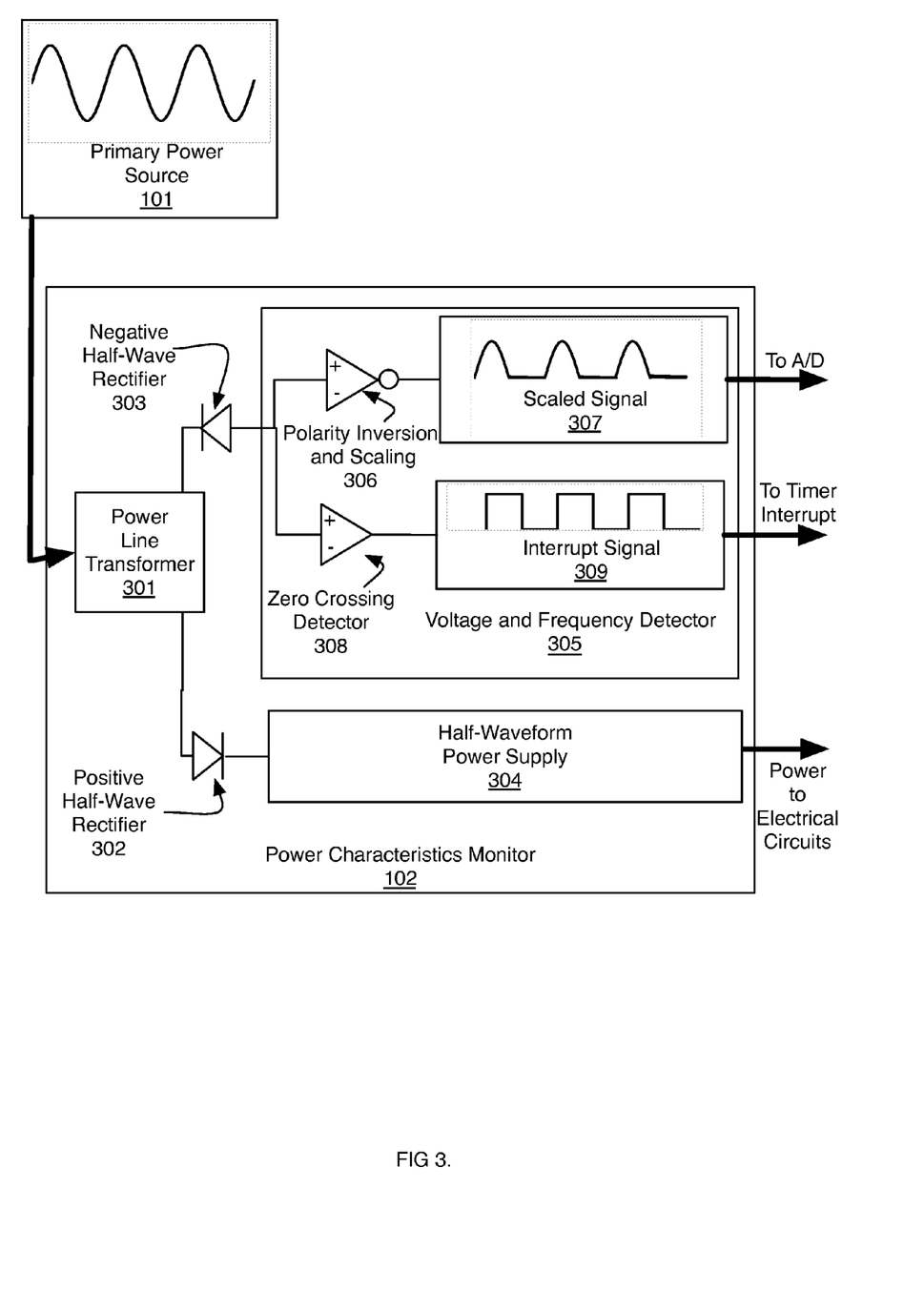
FIG. 3 is a component schematic of a power characteristics monitor.

FIG. 3 shows an embodiment of power characteristics monitor 102. The primary power source 101, usually grid line power, is connected directly to power characteristics monitor 102. Primary power source 101 is taken through a power line transformer 301 to reduce its voltage levels—for example to a 5VAC range—and then passed through circuitry to split the signal into two component waveforms. The signal splitter comprises a positive half-wave rectifier 302 and negative half-wave rectifier 303. Positive half-wave rectifier 302 feeds the first waveform into a half-waveform power supply 304, and negative half-wave rectifier 303 feeds the second waveform into a voltage and frequency detector 305. In an alternate embodiment, half-waveform power supply 304 may be replaced by an independent linear power supply or by a separate AC power transformer. In any case, the half-wave power supply is then able to power electrical circuits including the central control point itself. The polarities feeding voltage and frequency detector 305 and half-waveform power supply 304 could be reversed and still achieve the same functionality. Within voltage and frequency detector 305 there are two additional sub-circuits, a polarity inversion and scaling apparatus 306, which produce a scaled signal 307, and a zero crossing detector 308, which produces an interrupt signal 309. In some examples, scaled signal 307 is delivered to microprocessor A/D converter 207 shown in FIG. 2, and interrupt signal 309 is delivered to a microprocessor timer such as timer interrupt 206, also shown in FIG. 2.

Polarity inversion and scaling apparatus 306 may be implemented using an operational amplifier op-amp in an inverting configuration. Such op-amps with controllable gain also exist, for example the LMH6502 manufactured by National Semiconductor. Interrupt signal 309, produced by zero crossing detector 308, may be any sharp-edged signal synchronous with the line source zero-crossings. For example, a square wave output may be achieved using a comparator, such as the LM392 manufactured by National Semiconductor, when one input of the comparator is tied to ground.

Sampled data from microprocessor A/D converter 207 shown in FIG. 2 may be used to perform digital signal processing transform functions to detect various conditions included within the waveform from the primary power source, or to simply measure the amplitude of the signal to measure voltage changes. Timer interrupt 206 may be used to detect phase shifts in the waveform from the primary power source. In some embodiments both amplitude and frequency characteristics are derived using the A/D converter. In alternative embodiments, timer interrupt 206 could be used to detect frequency anomalies and A/D converter 207 could be used to detect voltage amplitude anomalies.

Algorithmic Components

Figure 5A:
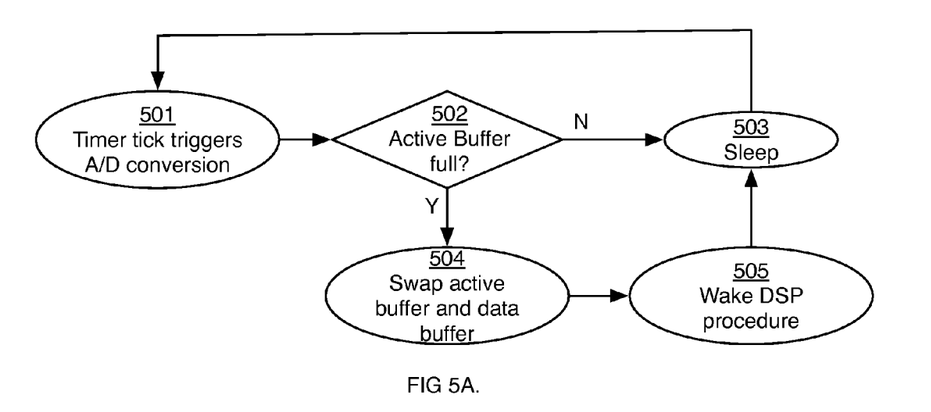
FIG. 5a and FIG. 5b are examples of flowcharts of main procedures performed by a line disturbance detector.
Figure 5B:
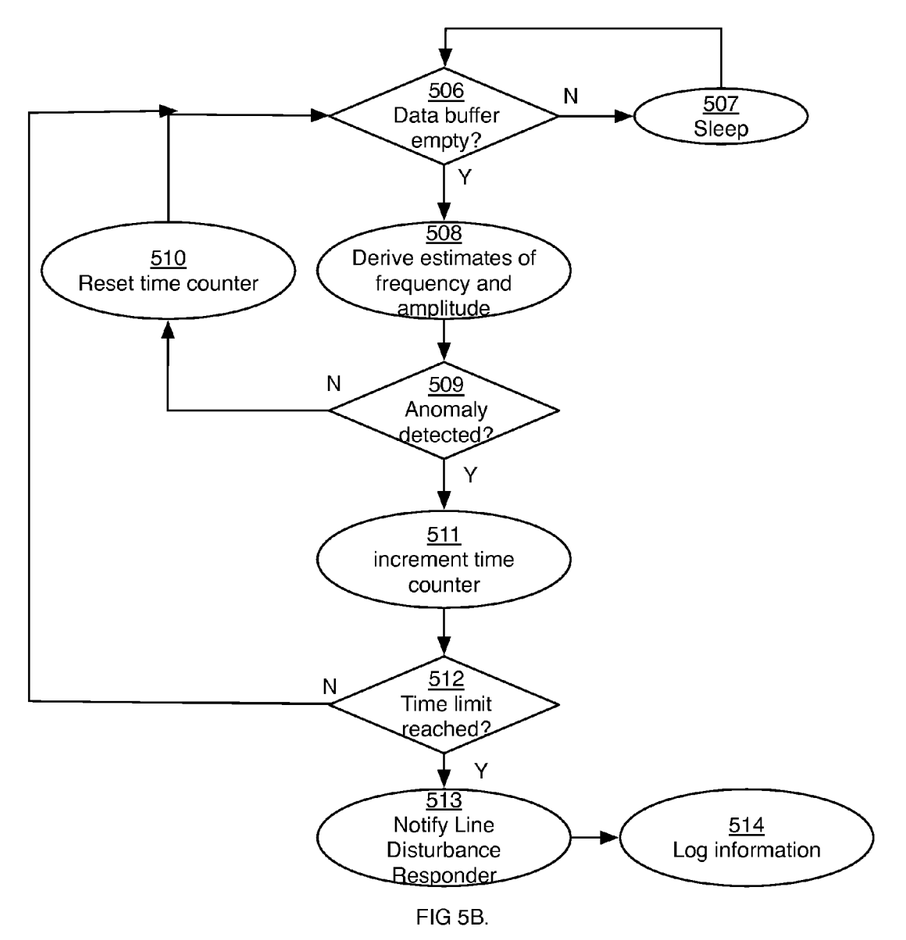

FIG. 5a and FIG. 5b show examples of the functions performed by line disturbance detector 103 shown in FIG. 1. Specifically, FIG. 5a shows the steps in processing the analog to digital A/D processing and FIG. 5b shows the steps in the digital signal processing (DSP) of the present disclosure. In the analog to digital processing, samples of raw data are taken by the microprocessor A/D converter, as shown at 501, using a timer tick, which awakens the circuit and begins the A/D sampling. The sampling process uses a random access memory double buffer swapping approach. We use the term active buffer to denote the buffer being filled by the A/D converter and the term data buffer to denote the buffer that has already been filled and swapped out. The A/D sampling is triggered by an internal timer signal set up to trigger at a rate at least as high as the Nyquist rate, that is twice the expected line frequency usually 120 samples per second for 60 Hz, 100 samples per second for 50 Hz. For the digital signal processing algorithms to be described in the present disclosure, however, this sampling rate should be considerably higher than the Nyquist rate in order to provide several digital samples during the course of one-quarter of the nominally sinusoidal waveform. The digital data samples are stored in the active buffer by the A/D converter 207 and the system checks to see if this active buffer is full, as shown at 502. If it is not full, the system sleeps, as shown at 503, until the next internal timer tick, in the step shown at 501. If the active buffer is full, the system swaps the active buffer and data buffer, as shown at 504, and wakes the digital signal processing, as shown at 505. It then sleeps in the step shown at 503 until the next internal timer tick in the step shown at 501. The full data buffer is processed by the digital signal digital signal processing DSP procedure shown in FIG. 5b.

The internal timer tick interval and size of the buffers are together configured so that there are enough digital samples in the data buffer to ensure that there is an adequate representation of the scaled signal to process and detect disturbances within the time limits set in the configuration parameters, yet sufficient to allow digital signal processing to complete on the data buffer before the active buffer is full again.

The digital signal processing of FIG. 5b begins with the system entering a procedural loop where it first checks if the data buffer is empty, as shown at 506. If the data buffer is empty, the system sleeps, as shown at 507, until it is next notified that there is a full data buffer. If the data buffer has data, then, in the step shown at 508, the system reads this data, and derives estimates of amplitude and frequency. The estimates of frequency and amplitude may be derived using one of a number of data fitting techniques, some of which are described later in this disclosure. In the step shown at 509, the estimates are compared to those specified in the configuration parameters stored in local memory. The comparison may show that the line characteristics are within all normal parameters as defined by the configuration parameters or it may show an anomaly that is a violation of preset voltage and frequency limits, indicating the potential occurrence of one or more line disturbance types as defined by the configuration parameters. Such line disturbance types may include line under-frequency or LUF (frequency below the acceptable value), line over-frequency or LOF (frequency above the acceptable value), line under-voltage LUV (voltage amplitude below the acceptable value), or line over-voltage LOV (voltage amplitude above the acceptable value). If no anomaly is detected, a time counter is reset in the step shown at 510 and the system loops back to check again if the data buffer is empty, in the step shown at 506. If an anomaly is detected, a time counter for the particular type of line disturbance indicated by the anomaly is incremented, as shown at 511. The time indicated by the counter is then checked, as shown at 512, to see if a time limit for that type of line disturbance, specified in the configuration parameters, has been exceeded. If so, this indicates a line anomalies have persisted for a threshold period of time that indicates the occurrence of a line disturbance event that requires an immediate response to alter the load. The system then notifies the line disturbance responder of the line disturbance event, as shown at 513, and it may then log information regarding the detected disturbance details and the line disturbance type, as shown at 514, in the logging system.

Figure 6:
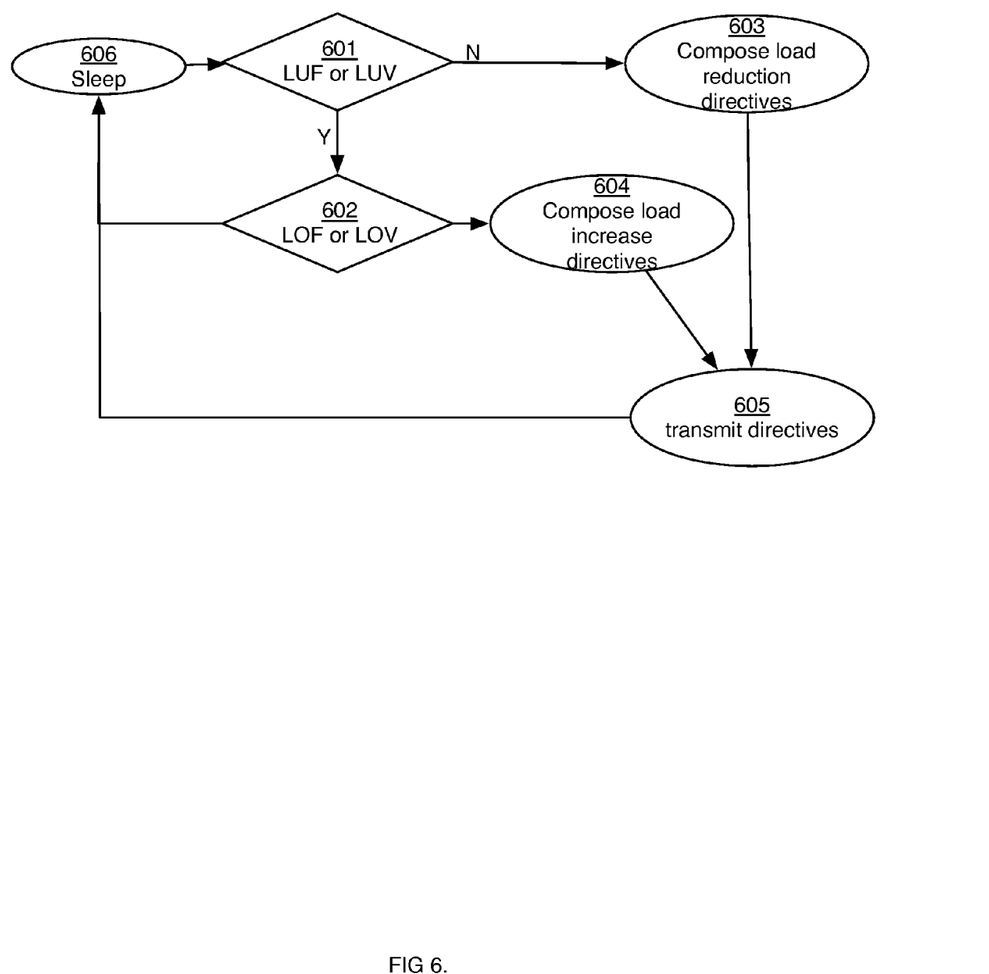
FIG. 6 is an example of a flowchart of a main procedure performed by a line disturbance responder.

FIG. 6 shows the steps in the digital signal processing performed by line disturbance responder 105 shown in FIG. 1. Once the line disturbance responder has been notified of a line disturbance event, as shown at step 513 of FIG. 5b, it first checks the line disturbance type. If, as shown in FIG. 6 in the step at 601, it finds it to be a line disturbance type of LUF or LUV, then in the step shown at 603 control directives are composed to be sent to the various load control devices and grid friendly appliances to cause a reduction in load. Additional logic rules and algorithms may be implemented in the step shown at 603 in order to determine specific devices to be controlled and the specific details of the controlling actions. For example, it may be determined that the appropriate action is to reduce the load from some devices and to turn off other devices. The determined control directives are transmitted, as shown at 605, via network 109 of FIG. 1, to each of the targeted load control devices and grid friendly appliances. If, in the step shown at 601, the line disturbance type is found to be neither an LUF nor an LUV, then the system checks in the step shown at 602 to see if the line disturbance is of type LOF or LOV. If so, appropriate control directives are composed in the step shown at 604 to cause an increase in load. Again, additional logic rules and algorithms may be implemented in the step shown at 604 in order to determine specific devices so be controlled and the specific details of the controlling actions. And similar to the previous case, the determined directives are transmitted at 605, via the network to each of the targeted load control devices and grid friendly appliances. In the case of the load control devices, the load control device firmware will activate the load increase or decrease on the load device, and then return a result message (either a confirmation or error message) to the central control point wherein the logging system will record it along with timestamps. In the case of grid friendly appliances, the response to the transmitted load control directive is handled by the firmware of the particular appliance. Since returning the appliance may not support returning a result message, the line disturbance responder may only be able to log information regarding the unconfirmed directive transmission to the logging system.

After checking the line disturbance type and executing the appropriate responses, the system sleeps in the step shown at 606 until it is again notified by the line disturbance detector that a line disturbance event has occurred.

DESCRIPTION OF OPERATION

Detection of Voltage and Frequency Characteristics

Figure 4:
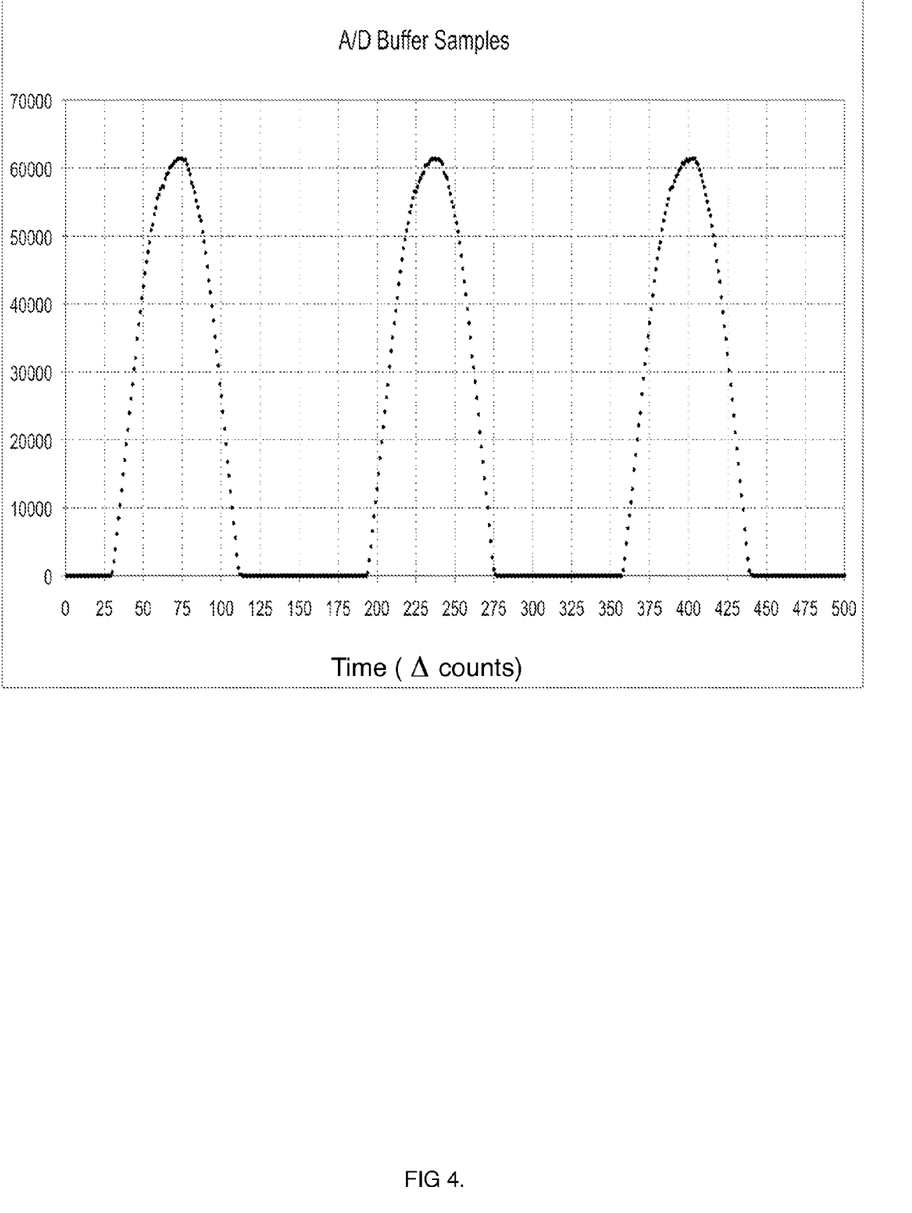
FIG. 4 is a representation of digitally sampled output of a voltage and frequency detector circuit in the power characteristics monitor of FIG. 3.

Embodiments of the central control point system use a single AC power supply transformer, connected to the primary power source (i.e., the wall socket), for both system power and isolated power line measurements. Since the transformer has a non-zero impedance, it is desired not to use a conventional full-wave bridge AC to DC conversion system as variations in the power supply load by the central control point would cause variations in the amplitude and phase of the voltages presented to the voltage and frequency detector. Although the variations could be addressed by designing a constant current load for the power supply, the effects of waveform distortion as the input capacitors charged would still be evident. To minimize the loading and distortion effects, the power supply only uses one half of the input line cycle to charge the input filter capacitors for the DC power supply. The other half of the input line cycle is used by the voltage sensing system for the power line amplitude measurements. Since this second half cycle is very lightly loaded, it represents very closely the ideal case of input voltage factored by the transformer turns ratio. In order to avoid overrun of a buffer while analysis and detection of line disturbances and anomalies is performed, a double buffer scheme is used. Measured waveforms using this approach show that the waveform is a close approximation of the primary power source input voltage waveform, and the double buffer scheme faithfully captures the digitized data without overrunning the buffer. This double buffer scheme is not required for implementing systems of this disclosure, but it allows slower and less expensive microprocessors to be used for the power characteristics monitor, which achieves lower overall cost of the system. FIG. 4 is a representation of the waveform captured by a microprocessor 16-bit A/D conversion of a 60 Hz signal from the voltage and frequency detector in the power characteristics monitor. The sampling interval, $\Delta$, in this sample was 100 microseconds.

Analysis and Detection of Anomalies

Introduction:

A number of techniques may be used to process the digital samples from the data buffer in order to make estimates of waveform parameters, including in particular the frequency and amplitude of the incoming line voltage signal. These techniques include, but are not limited to; least-squares fitting and fast-Fourier transform techniques. Some embodiments of the disclosure estimate the waveform parameters, using the digitally sampled time series of voltage source signals, and making discrete estimates of the first and second order derivatives (i.e. the slope and curvature) of the time series. This approach, which is further explained below, uses only the A/D input data and does not rely on interrupt signal 309 from zero crossing detector 308, both shown in FIG. 3, to estimate frequency or phase shifts. In an alternate embodiment of the disclosure, the A/D could be used to estimate the voltage amplitude while the interrupt signal is used to detect frequency anomalies. One possible concern with using the A/D for amplitude detection, however, is possible clipping of the waveform due to other loads on the main power source. A boost-converter may be used in voltage and frequency detector 305 to avoid clipping. Embodiments using the discrete estimate approach can detect the clipping in the data series from the A/D circuitry, and can simply avoid using this portion of the sampled series in deriving the frequency and amplitude estimates. The discrete estimate approach also allows for the frequency and amplitude estimates to be made with short sets of sampled data points, depending on the level of higher frequency noise and harmonics present in the signal. In the ideal scenario, where there is no signal noise, the approach is subject only to the errors introduced in the bit resolution of the A/D sampling, and frequency and amplitude estimates can be made with only three sample data points.

Source Signal Forms and Assumptions:

Performing discrete estimates of slopes and derivatives from digitally sampled time series is a straight-forward and commonly used numerical technique. First, consider the pure sinusoidal portion of the sampled signal and its first and second order derivatives (slope and curvature).

$$y = A \sin(2\pi ft)$$

$$y' = A 2\pi f \cos(2\pi ft)$$

$$y'' = -A(2\pi f)^2 \sin(2\pi ft)$$

Denoting the $i^{th}$ discrete sample as $y_i$ and the time interval between samples as $\Delta$, then the slope and curvature may be estimated as:

$$y'_i = \frac{y_{i+1} - y_{i-1}}{2\Delta}$$

and $$y''_i = \frac{\frac{y_{i+1} - y_i}{\Delta} - \frac{y_i - y_{i-1}}{\Delta}}{\Delta}$$

$$\Rightarrow$$

$$y''_i = \frac{y_{i+1} - 2y_i + y_{i-1}}{\Delta^2}$$

Those skilled in the art of mathematics can readily derive the corresponding discrete estimates of frequency, $f_i$, and amplitude, $A_i$, as:

$$f_i = \frac{\sqrt{\frac{-y_{i+1} + 2y_i - y_{i-1}}{y_u}}}{2\pi\Delta}$$

and $$A_i = \sqrt{y_i^2 + \left(\frac{y_{i+1} - y_{i-1}}{\Delta 4\pi f_i}\right)^2}$$

In some embodiments of the disclosure, these formulae may be applied to the digitized waveform, and in doing so, more information from a given sequence of samples may be available than would be considered by simply examining the points of zero-crossing (for determining frequency) and the waveform peaks (for determining amplitude) alone. Moreover, these embodiments obtain the results in a numerically more efficient manner than other fitting techniques.

For illustration purposes, assume that the source signal is a nominal 60 Hz sinusoidal voltage level of amplitude A=1 volt. Only the positive portions of the sinusoidal signal are available in the scaled signal, which is sampled into the data buffer. Further assume that the peaks are distorted such that the top 10% of the sinusoid is distorted or even clipped due to over-voltage conditions within the voltage and frequency detector. This waveform shown in FIG. 4 shows some minor distortion of this kind around the peaks. Each set of three data points within the range above zero and below the clipped portion can then contribute to a single discrete estimate of frequency and amplitude. The sequence of estimates across the sampled data buffer may be then averaged to determine the best estimate of the frequency and amplitude of the signal over the sampled window, which we will denote as the "measured frequency" and "measured amplitude".

If we assume that the data buffer is denoted as D[0:X] where D[0] is the first entry in the buffer and D[X] is the last, then the first estimate will use $y_i$=D[1] $y_{i-1}$=D[0] and $y_{i+1}$=D[2]; and $\Delta$ will be the sampling period in seconds. Using $\Delta$=0.0002 seconds would produce a ~80× sampling period for the nominal 60 Hz waveform. Using these numbers in the equations allows both the frequency estimate and amplitude estimate to be calculated.

The measured frequency and amplitude may be obtained from a simple average of the sequence of estimates, or from a weighted average of the sequence of estimates in order to give some of the estimates greater importance. For example the later estimates in the sequence, which represent the most recent data chronologically, may be given greater importance than the earlier ones. Or one may consider estimates that use data points sampled along the peaks of the waveforms, but give them lower weights in the averaging in order to reduce the influence of distortions that may be present in the peaks.

Signal and Sampling Errors:

As mentioned, signal errors may be introduced to the waveform, which will distort the ideal sinusoidal signal. These may include higher frequency noise within the source signal, higher harmonics, and clipping of the signal due to various resistive loads on the line. The clipping can be readily handled by avoiding use of data samples taken in near the peaks of the sinusoidal signal. Higher frequency noise or harmonics are generally negligible, but if present can introduce a small bias error, $\epsilon_n$, in the estimated values. A sampling error will also be present in the sampled signal due to the finite resolution of an analog to digital converter. For example, a 12-bit A-D converter will cause each sampled point to have an error on the order of:

$$\varepsilon_S = \frac{R}{2} \times 2^{-12}$$

where R is the full value signal range of the A/D converter. Including these potential errors, each sampled point may be expressed:

$$y = \sin(2\pi ft) + \epsilon_n + \epsilon_S$$

These signal and sampling errors will propagate through the equations to produce an expected measurement error on the measured frequency, $\epsilon_m^f$, and an expected measurement error on the measured amplitude, $\epsilon_m^A$.

Detecting Anomalies in the Sampled Data:

Detecting an anomaly in the sampled data is thus a function of comparing the estimated frequency and amplitude estimate to the expected values and preset limits on those values. Electrical distribution power quality in the U.S. should fall between the limits of 118VAC and 122VAC for a single phase of a three phase power system supplying a building, and between 59.95 Hz and 60.05 Hz. Different grid operators define their limits for under-frequency or under-voltage differently; furthermore, the cold load pickup limits will optimally be customized to, for example, the specific grid feeder characteristics. It is therefore important, for the system to be practically effective, to be able to configure the limits dynamically, and to enable them to be modified by a grid operator or third party aggregator. In addition, some appliances may handle voltage and frequency changes less gracefully than others. An important option, therefore, is to measure and detect changes against nominal in addition to comparing to absolute voltage and frequency limits.

An LOV or LUV line disturbance is thus indicated whenever an amplitude measurement, taking into account the potential measurement errors, falls outside the absolute limits. That is:

$$A_m - |\epsilon_m^A| > A_{hi} \Rightarrow \text{LOV}$$

$$A_m + |\epsilon_m^A| < A_{lo} \Rightarrow \text{LUV}$$

where $A_m$ is the measured amplitude, $A_{hi}$ is the preset upper limit allowed for the amplitude, and $A_{lo}$ is the preset lower limit for the amplitude, and $\epsilon_m^A$ is the expected measurement error on amplitude.

Alternatively, an anomaly could be detected based upon change from a baseline, or nominal, condition as follows:

$$A_m - |\epsilon_m^A| > (A_{nom} + \alpha_A) \Rightarrow \text{LOV}$$

$$A_m + |\epsilon_m^A| < (A_{nom} - \Delta_A) \Rightarrow \text{LUV}$$

where $A_{nom}$ is the nominal voltage amplitude and $\Delta_A$ is the preset delta limit for the amplitude.

A LOF or LUF anomaly is defined as frequency measurement, which falls outside the limits set as follows:

$$f_m - |\epsilon_m^f| > f_{hi} \Rightarrow \text{LOF}$$

$$f_m + |\epsilon_m^f| < f_{lo} \Rightarrow \text{LUF}$$

where $f_m$ is the measured frequency, $f_{hi}$ is the preset upper limit for frequency, and $f_{lo}$ is the preset lower limit for frequency, and $\epsilon_m^f$ is the expected measurement error on frequency.

Alternatively, an anomaly could be detected based upon change from a baseline, or nominal, condition as follows:

$$f_m - |\epsilon_m^f| > (f_{nom} + \Delta_f) \Rightarrow \text{LOF}$$

$$f_m + |\epsilon_m^f| < (f_{nom} - \Delta_f) \Rightarrow \text{LUF}$$

where $f_m$ is the nominal frequency and $\Delta_f$ is the preset delta limit for the frequency.

In order to detect a line disturbance, the line disturbance detector must detect the existence of the anomaly based on measured frequency and amplitude, persisting for a period of time greater than a specified time limit. For example, an under-frequency line disturbance might require the line disturbance detector detect an anomaly of type LUF persistently for at least six cycles, or 100 milliseconds.

Response to Anomalies

The steps involved in responding to detected anomalies are:

1) Requesting load increase, decrease, or disconnect from the control points

2) Confirmation of actual load increase, decrease, or disconnect by the control points 3) Recording the event and the response to it in non-volatile memory Once a line disturbance event is detected, the central control point takes immediate action to adjust the load within the building to properly respond to the line disturbance. Under-voltage and under-frequency conditions signal an overloaded power source. The proper response is to reduce load. An over-voltage or over-frequency condition denotes an under-loaded power source. The proper response is to increase load. The described embodiment of the present disclosure performs no special algorithm to request different levels of setback; the response is a simple request to each load control device to reduce the maximum amount allowed by its programming. In most cases this will result in an immediate disconnect of the load from the line. More graceful shut downs can be implemented under this disclosure.

When the central control point detects that line voltage characteristics have returned to within configuration parameters, each load control device and grid friendly appliance may be sent control directives and messages causing the loads to be increased, decreased, or reconnected. In some embodiments, these control directives are issued so as to avoid overloading the grid during start-up, by ensuring that the energy consuming devices and appliances do not resume operation simultaneously. In this way, the central control point achieves a graceful recovery from the line disturbance. In these embodiments, this graceful recovery may use a random start-up delay for each energy consuming device and may also use a random start-up order for turning on the loads over a time period specified in the configuration parameters, or it may use a user-specified values, obtained from the configuration parameters, for the start-up delays and start-up order. An alternative embodiment would be to pre-program the load control devices with their start-up delays rather than send control directives from the central control point to start up. More complex algorithms could be applied, and are within the scope of this disclosure.

If the disturbance in the line voltage results in a total shut down of the central control point itself, the embodiments of the present disclosure may perform a normal startup function when power returns. The central control point will attempt to bring all loads on line per the programmed operational limits, using a random order of load turn-on over a time period read from the configuration parameters. An alternative embodiment would be to pre-program the load control devices with these start-up delays rather than send requests from the central control point during start up, with the load control devices storing the instructions in non-volatile memory to persist over a power outage. More complex algorithms could be applied, and are under the scope of this disclosure.

ADVANTAGES

This present disclosure provides an economically viable and scalable platform that can automate a whole building's instantaneous response to line disturbances. For example, the systems and methods disclosed herein are:

1) Is cost effective. Without the present systems or methods, circuitry for detecting power source anomalies would be required in each load control device. There is thus an inherent cost advantage to using the described central control point to detect the disturbance. This disclosure provides an economically viable and scalable platform that can prevent voltage or frequency based islanding or collapse of the electrical grid system, due to localized or widespread grid system perturbations.

2) Allows monitoring, messaging to and control and protection of appliances with and without built-in control interfaces that are sensitive to frequency or voltage disturbances.

3) Can be installed and retrofitted to appliances or built-in at the original equipment manufacturer stage.

4) Can use a wide range of communication capabilities to effect monitoring and control.

5) Can protect a wide range of appliances from catastrophic failure due to frequency or voltage perturbations, without the need for relays to sense voltage or frequency. Protection is provided by a remote device communicating to the appliance.

6) Allows very granular control of appliances across a large electrical grid system, so that grid protection can be coordinated based on localized demand and generation resources.

EXAMPLE APPLICATION

Systems and methods of the present disclosure may be used for electrical grid system stability and reliability control. Currently there are no economic options for controlling a diverse range of end use appliances or equipment with programmable levels for both voltage and frequency. The present disclosure provides full programmability via a central control point within an industrial, commercial or residential location for use by the grid system operator.

This application model would allow a grid operator to stage the frequency or voltage response of the end use loads to different levels, allowing grid operators in different control areas to coordinate frequency and voltage setting based on generation location and load flows across the grid. A specific example would be summer versus winter setting in the Pacific Northwest versus the Southwestern US. It would also allow grid operators to set morning versus evening flows for maximum system stability and protection, should a large generation source fail or a transmission line go out of service.

Another level of control would be offered by the ability to stage appliance responses based on frequency drop amount and criticality of load type. By first dropping load on hot water heaters or other low priority loads, a system collapse may be prevented without interrupting higher value loads, but if the initial response were not effective, additional appliances could be removed from operation.

An example of the application of this disclosure to an under voltage disturbance would be to first remove all loads that have torque characteristics, such as air conditioners, versus loads that do not have torque characteristics. This could prevent the spread of islanding of the grid, or a grid outage, and could only be accomplished with local central control devices which could be programmed remotely.

This disclosure may include one or more independent or interdependent inventions directed to various combinations of features, functions, elements, and/or properties. While examples of apparatus and methods are particularly shown and described, many variations may be made therein. Various combinations and sub-combinations of features, functions, elements, and/or properties may be claimed in one or more related applications. Such variations, whether they are directed to different combinations or the same combinations, whether different, broader, narrower, or equal in scope, are regarded as included within the subject matter of the present disclosure.

The described examples are illustrative and directed to specific examples of apparatus and/or methods rather than a specific invention, and no single feature or element, or combination thereof, is essential to all possible combinations. Thus, any one of the various inventions that may be claimed based on the disclosed example or examples does not necessarily encompass all or any of particular features, characteristics, or combinations unless subsequently specifically claimed. Where "a" or "a first" element of equivalent thereof is recited, such usage includes one or more such elements, neither requiring nor excluding two or more such elements. Further, ordinal indicators, such as first, second, or third, for identified elements are used to distinguish between the elements and do not indicate a required or limited number of such elements, and do not indicate a particular position or order of such elements unless otherwise specifically indicated.

We claim:

1. A system for detecting a line disturbance in a line power to at least a portion of a building and coordinating a response for energy-consuming loads in the building, the system comprising:
    a load control device adapted to communicate with one or more energy consuming devices, the load control device having a load control device firmware adapted to receive and process control directives to change the load of at least one energy consuming device; and
    a central control point associated with the building and connected to the line power, the central control point including:
        one or more electrical circuits including a central point firmware, the central control point firmware adapted to detect the line disturbance, the central control point firmware being in communication with the load control device firmware and adapted to transmit the control directives to the load control device firmware, and
        at least one circuit adapted to monitor the line power that includes:
        a signal splitter adapted to derive a first waveform and a second waveform from the line power;
        a power supply adapted to derive a DC power from the first waveform and adapted to deliver the DC power to the one or more electrical circuits; and
        a filter and waveform conditioner adapted to derive a low-noise waveform from the second waveform and to transmit the low-noise waveform to a microprocessor for use by a digital signal processor adapted to detect the line frequency and voltage anomalies.

2. The system as set forth in claim 1, where the central control point is in communication with and transmits one or more control directives to at least one or more grid friendly appliances.

3. The system as set forth in claim 1, wherein the central control point is in communication with a user interface application.

4. The system as set forth in claim 3, wherein:
    the central control point firmware is adapted to receive and store one or more configuration parameters from the user interface application, the configuration parameters defining one or more line disturbance types.

5. The system of claim 4, wherein the configuration parameters include:
    a limit parameter defining one of a minimum voltage, a maximum voltage, a minimum frequency, and a maximum frequency, and
    a duration of time; and
    wherein the central control point firmware is adapted to detect the line disturbance when the line power satisfies the conditions defined by the limit parameter for the duration of time.

6. The system of claim 4, wherein the configuration parameters include a plurality of ranges defining a voltage range and a frequency range, and wherein the central control point firmware is adapted to detect the line disturbance when the line power satisfies the conditions defined by the voltage range and the frequency range.

7. The system as set forth in claim 1, wherein the central control point firmware is further adapted to log event information relating to the detected line disturbance.

8. The system as set forth in claim 7, wherein the logged event information includes a timeline history of the line conditions before, during, and after the line disturbance.

9. The system as set forth in claim 7, wherein the logged event information includes conditions of the one or more load devices before, during, and after the line disturbance.

10. The system as set forth in claim 7, wherein the logged event information includes information relating to one more control directives transmitted before, during, and after the line disturbance.

11. The system as set forth in claim 1, where the central control point is further adapted to gracefully recover from the line disturbance.

12. An apparatus for detecting line frequency and voltage anomalies in a line power supplied to a central control point power source, the apparatus comprising:
    a signal splitter adapted to derive a first waveform and a second waveform from the line power;

a power supply adapted to derive a DC power from the first waveform and adapted to deliver the DC power to one or more electrical circuits; and a filter and waveform conditioner adapted to derive a low-noise waveform from the second waveform and to transmit the low-noise waveform to a microprocessor for use by a digital signal processor adapted to detect the line frequency and voltage anomalies.

13. The apparatus as set forth in claim 12, wherein the first waveform corresponds to a portion of the line power having a voltage that is one of greater than and less than a predetermined value.

14. The apparatus as set forth in claim 13, wherein the predetermined value is zero.

15. The apparatus of claim 12, wherein the power supply is adapted to deliver the DC power to at least one of the microprocessor and the digital signal processor.

16. The central control point of claim 15, wherein the power supply is adapted to deliver the DC power to at least one of the microprocessor and the digital signal processor.

17. A central control point for a system for detecting a line disturbance in a line power to at least a portion of a building and coordinating a response for energy-consuming loads in the building, the central control point comprising:

one or more electrical circuits adapted to communicate with at least one load control device disposed separate from the central control point;

a signal splitter adapted to derive a first waveform and a second waveform from the line power;

a power supply adapted to derive a DC power from the first waveform and adapted to deliver the DC power to the one or more electrical circuits; and a filter and waveform conditioner adapted to derive a low-noise waveform from the second waveform and to transmit the low-noise waveform to a microprocessor for use by a digital signal processor adapted to detect the line frequency and voltage anomalies.

18. The system of claim 17, wherein the configuration parameters include: a plurality of pairs of configuration parameters and durations of time, and wherein the central control point firmware is adapted to detect the line disturbance when the line power satisfies the conditions defined each limit parameter for the corresponding duration of time.

* * * * *